(12) United States Patent
Singh et al.

(10) Patent No.: US 12,353,341 B2
(45) Date of Patent: Jul. 8, 2025

(54) TUNING OF READ/WRITE CYCLE TIME DELAY FOR A MEMORY CIRCUIT DEPENDENT ON OPERATIONAL MODE SELECTION

(71) Applicant: STMicroelectronics International N.V., Geneva (CH)

(72) Inventors: Bhupender Singh, New Delhi (IN); Hitesh Chawla, Noida (IN); Tanuj Kumar, Noida (IN); Harsh Rawat, Faridabad (IN); Kedar Janardan Dhori, Ghaziabad (IN); Promod Kumar, Greater Noida (IN); Manuj Ayodhyawasi, Noida (IN); Nitin Chawla, Noida (IN)

(73) Assignee: STMicroelectronics International N.V., Geneva (CH)

( * ) Notice: Subject to any disclaimer, the term of this patent is extended or adjusted under 35 U.S.C. 154(b) by 39 days.

(21) Appl. No.: 18/379,373

(22) Filed: Oct. 12, 2023

(65) Prior Publication Data
US 2024/0143239 A1    May 2, 2024

Related U.S. Application Data

(60) Provisional application No. 63/419,457, filed on Oct. 26, 2022.

(51) Int. Cl.
G06F 12/00    (2006.01)
G06F 3/06     (2006.01)
G06F 13/16    (2006.01)

(52) U.S. Cl.
CPC .......... *G06F 13/1689* (2013.01); *G06F 3/061* (2013.01); *G06F 3/0655* (2013.01); *G06F 3/0673* (2013.01)

(58) Field of Classification Search
None
See application file for complete search history.

(56) References Cited

U.S. PATENT DOCUMENTS

| | | | | |
|---|---|---|---|---|
| 2002/0167858 A1* | 11/2002 | Wilkins | ................ | G11C 7/227 |
| | | | | 365/233.1 |
| 2019/0279707 A1* | 9/2019 | Pathak | ................ | G11C 11/412 |
| 2023/0018420 A1* | 1/2023 | Verma | ................ | G11C 11/418 |

FOREIGN PATENT DOCUMENTS

CN     114237496 A     3/2022

OTHER PUBLICATIONS

Pasandi, Ghasem et al: "Internal Write-Back and Read-Before-Write Schemes to Eliminate the Disturbance to the Half-Selected Cells in SRAMS," IET Circuits Devices System, 2018, vol. 12 Iss. 4, pp. 460-466.

(Continued)

*Primary Examiner* — Daniel D Tsui
(74) *Attorney, Agent, or Firm* — Crowe & Dunlevy LLC (57) ABSTRACT

A memory circuit includes an array of memory cells arranged in rows and columns. A word line is connected to the memory cells of each row. A row decoder circuit operates in response to an internal clock and an address to selectively apply a word line signal to one word line and further generate a dummy word line signal. A control circuit includes a clock generator that generates the internal clock which is reset in response to a reset signal. A first delay circuit receives the dummy word line signal and outputs a first delayed dummy word line signal. A second delay circuit receives the dummy word line signal and outputs a second delayed dummy word line signal. A multiplexer circuit selects between the first and second delayed dummy word line signals for output as the reset signal in response to a logic state of a mode control signal.

19 Claims, 4 Drawing Sheets

(56) References Cited

OTHER PUBLICATIONS

Farahani, Mostafa, et al.: "Performance and Power Solutions for Caches Using 8T SRAM Cells," University of Victoria, BC, Canada, Published Dec. 2012, 7 pgs.

Joo, Yongsoo, et al.: "Energy- and Endurance-Aware Design of Phase Change Memory Caches," Pennsylvania State University, Published Mar. 2010, 6 pgs.

Mittal, Sparsh, et al.: "A Survey of Architectural Approaches for Managing Embedded DRAM and Non-Volatile On-Chip Caches," IEEE Transactions on Parallel and Distributing Systems, DOI 10.1109/TPDS.2014.2324563, Published May 2014, 14 pgs.

\* cited by examiner

TUNING OF READ/WRITE CYCLE TIME DELAY FOR A MEMORY CIRCUIT DEPENDENT ON OPERATIONAL MODE SELECTION

CROSS REFERENCE TO RELATED APPLICATIONS

This application claims priority from United States Provisional Application for Patent No. 63/419,457, filed Oct. 26, 2022, the disclosure of which is incorporated herein by reference.

TECHNICAL FIELD

Embodiments herein relate to a memory circuit and, in particular, to a static random access memory (SRAM) architecture having a tuned read/write cycle time delay.

BACKGROUND

Figure 1A:
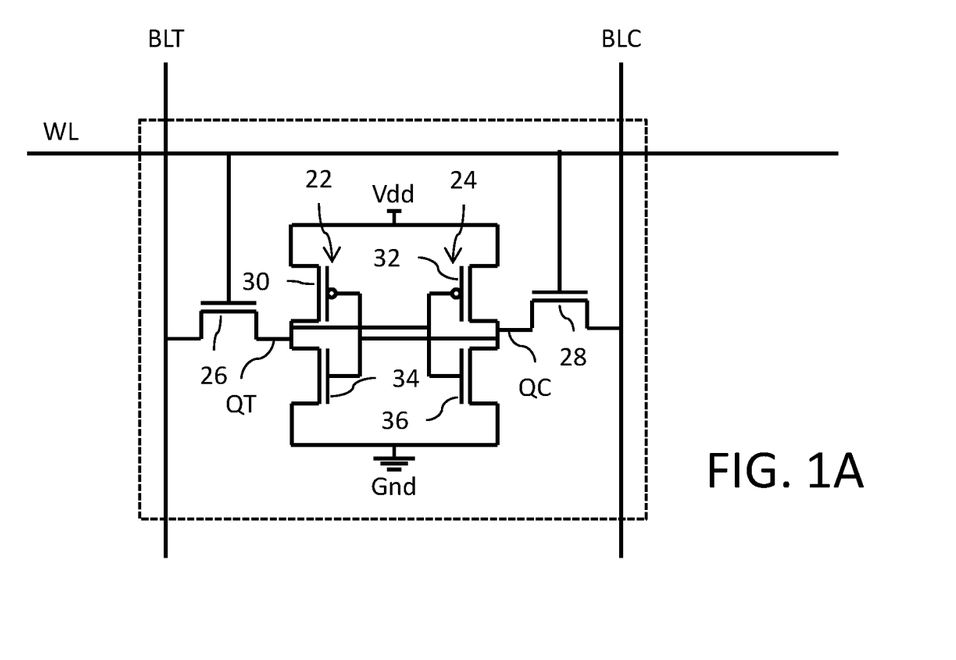
FIG. 1A is a circuit diagram of a standard 6 T static random access memory (SRAM) cell.

A static random access memory (SRAM) is formed by an array of memory cells arranged in a matrix format. In an embodiment, the memory cells are standard 6 T SRAM memory cells having a circuit configuration as shown in FIG. 1A. Each memory cell 14 of the SRAM 6 T type includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node.

Figure 1B:
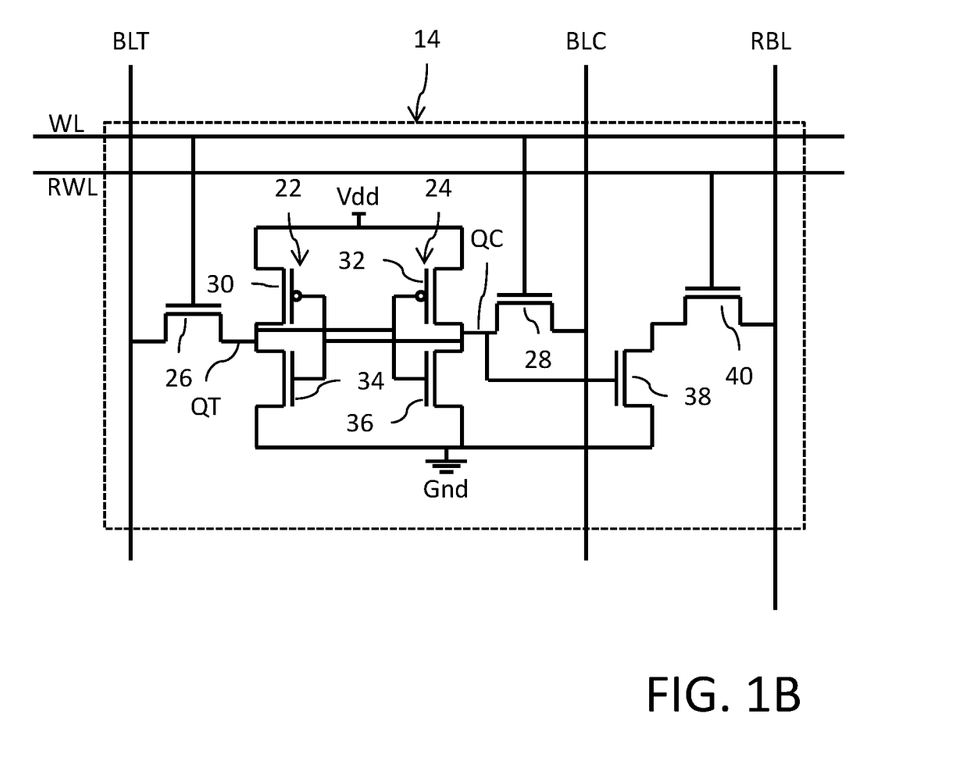
FIG. 1B is a circuit diagram of an 8 T SRAM cell.

In another embodiment, the memory cells are standard 8 T memory cells having a circuit configuration as shown in FIG. 1B. Each memory cell 14 of the SRAM 8 T type includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. A signal path between the read bit line RBL and the low supply voltage reference is formed by series coupled transistors 38 and 40. The gate terminal of the (read) transistor 38 is coupled to the complement storage node QC and the gate terminal of the (transfer) transistor 40 is coupled to receive the signal on the read word line RWL.

When writing to the 6 T or 8 T memory cells, the data to be written is applied by write circuitry of the memory to the complementary bit lines BLT, BLC, and the word line WL is asserted. The logic states on the complementary bit lines BLT, BLC are passed by the word line actuated transfer (passgate) transistors 26 and 28 and latched at the storage nodes QT and QC.

Consider the scenario where QT=1 and QC=0, and the write circuitry of the memory applies BLT=0 and BLC=1. In response to assertion of the word line WL=1, transistor 26 passes logic 0 to node QT and the transistor 32 is turned on to pull node QC to logic 1. Here, the critical device of the memory cell 14 for the write operation is pull up transistor 32. The time required for the write operation, which defines the frequency of write operation, is limited by the strength of the PMOS pull up device (transistor 32 in this case). To emulate the strength of the statistically worst PMOS device (transistor 32), as per the capacity and PPM requirement of the application, one way could be to shift the threshold voltage of the device by applicable sigma as per the technology in use.

When reading from the 6 T memory cells, the complementary bit lines BLT, BLC are precharged to a precharge voltage level, the word line WL is asserted, and one of the complementary bit lines BLT, BLC is discharged through its associated word line actuated transfer (passgate) transistor 26, 28 dependent on the logic state latched at the storage nodes QT and QC. The data on the complementary bit lines BLT, BLC is then sensed by read circuitry of the memory.

Consider the scenario where QT=0 and QC=1. In response to assertion of the word line WL=1, transistors 26 and 34 are turned on to discharge the true bit line BLT from the precharge voltage level to ground. Here, the critical devices of the memory cell for the read operation are passgate transistor 26 and pull down transistor 34. The time required for the read operation, which defines the frequency of read operation, is limited by the strength of the NMOS transistors 26 and 34. These NMOS transistors 26 and 34 can be emulated in a similar manner as describer for transistor 32 in the write operation.

When reading from the 8 T memory cells, the read bit line RBL is precharged to a precharge voltage level, the read word line RWL is asserted to turn on transistor 40, and the read bit line RBL is selectively discharged through transistor 38 dependent on the logic state latched at the storage node QC. The data on the read bit lines RBL is then sensed by read circuitry of the memory.

Consider the scenario where QT=0 and QC=1. In response to assertion of the read word line RWL=1, transistors 38 and 40 are turned on to discharge the read bit line RBL from the precharge voltage level to ground. Here, the critical devices of the memory cell for the read operation are transistors 38 and 40. The time required for the read operation, which defines the frequency of read operation, is limited by the strength of the transistors 38 and 40. These NMOS transistors 38 and 40 can be emulated in a similar manner as describer for transistor 32 in the write operation.

Figure 2:
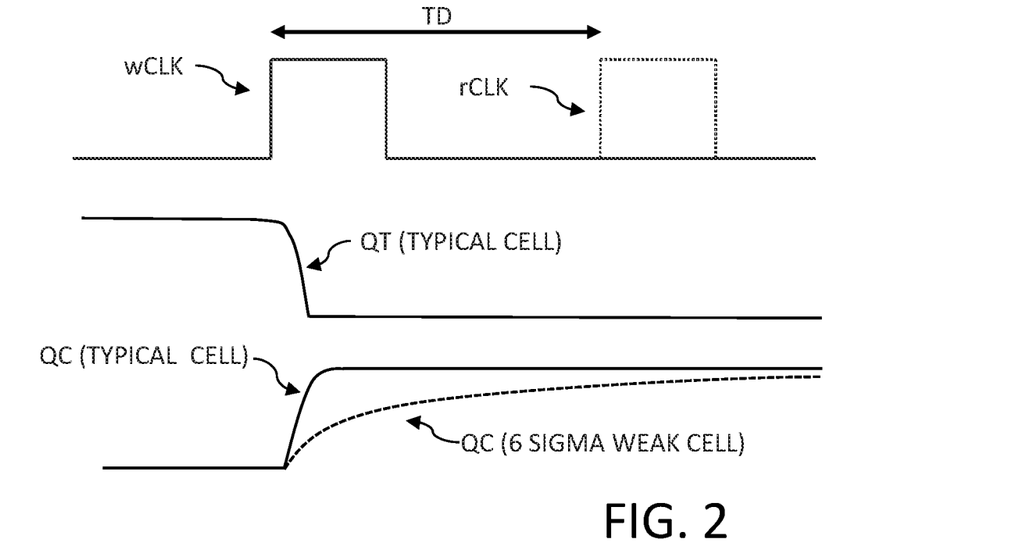
FIG. 2 is a timing diagram illustrating a write operation for an SRAM cell of the type shown in FIGS. 1A and 1B.

Reference is now made to FIG. 2 which shows a timing diagram for a write operation in a 6 T or 8 T memory cell to write logic 0 to the true data storage node QT and logic 1 to complement data storage node QC (where the true data storage node QT is currently storing logic 1 and the complement data storage node QC is currently storing logic 0). In response to assertion of the write clock wCLK, the word line WL is asserted, and the data latch of the memory cell begins to flip. The signal response at the true data storage node QT and complement data storage node QC for a typical memory cell is shown by the solid lines. However, in the case of a 6 Sigma weak memory cell with a signal response shown by the dashed line, the worst transistor 32 is slow to pull up the complement data storage node QC. This can have a negative effect on memory cycle time. The logic high data state latched at the data storage nodes QT and QC must be ensured (for example, at a voltage level more that 90% of Vdd) following a write operation before a subsequent read operation can be performed. As shown in the FIG. 2, this results in a significant time delay TD before a subsequent read cycle (with assertion of the read clock rCLK) can be initiated.

SUMMARY

A memory circuit comprises: a memory array including memory cells arranged in a matrix with plural rows and plural columns, each row including a word line connected to the memory cells of the row, and each column including a bit line connected to memory cells of the column; a row decoder circuit operating in response to an internal clock and a received address to selectively actuate one of the word lines with a word line signal through a word line driver and further actuate a dummy word line with a dummy word line signal through a dummy word line driver; and a control circuit.

In an embodiment, the control circuit comprises: a clock generator configured to generate said internal clock, wherein said internal clock is reset in response to a reset signal; a first delay circuit receiving the dummy word line signal and outputting a first delayed dummy word line signal; a second delay circuit receiving the dummy word line signal and outputting a second delayed dummy word line signal; and a first multiplexer circuit configured to receive the first and second delayed dummy word line signals and select said first delayed dummy word line signal for output as said reset signal in response to a first logic state of a mode control signal and select said second delayed dummy word line signal for output as said reset signal in response to a second logic state of the mode control signal.

The control circuit further comprises a multiplexing circuit configured to selectively pass the selected first/second delayed dummy word line signal for output as said reset signal in response to operation of the memory in one of a write mode or read mode.

The control circuit further comprises a third delay circuit receiving the dummy word line signal and outputting a third delayed dummy word line signal; a fourth delay circuit receiving the dummy word line signal and outputting a fourth delayed dummy word line signal; and a second multiplexer circuit configured to receive the third and fourth delayed dummy word line signals and select said third delayed dummy word line signal for output as said reset signal in response to the second logic state of a mode control signal and select said fourth delayed dummy word line signal for output as said reset signal in response to the first second logic state of the mode control signal.

The multiplexing circuit is further configured to selectively pass the selected third/fourth delayed dummy word line signal for output as said reset signal in response to operation of the memory in one of a write mode or read mode.

In another embodiment, the control circuit comprises: a clock generator configured to generate said internal clock, wherein said internal clock is reset in response to a reset signal; a first delay circuit receiving the dummy word line signal and outputting a first delayed dummy word line signal; a second delay circuit receiving the dummy word line signal and outputting a second delayed dummy word line signal; a first multiplexer circuit configured to receive the first and second delayed dummy word line signals and select said first delayed dummy word line signal for output as a write reset signal in response to a first logic state of a mode control signal and select said second delayed dummy word line signal for output as said write reset signal in response to second logic state of the mode control signal; a third delay circuit receiving the dummy word line signal and outputting a third delayed dummy word line signal; a fourth delay circuit receiving the dummy word line signal and outputting a fourth delayed dummy word line signal; a second multiplexer circuit configured to receive the third and fourth delayed dummy word line signals and select said third delayed dummy word line signal for output as a read reset signal in response to the first logic state of the mode control signal and select said fourth delayed dummy word line signal for output as said read reset signal in response to the second logic state of the mode control signal.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 3:
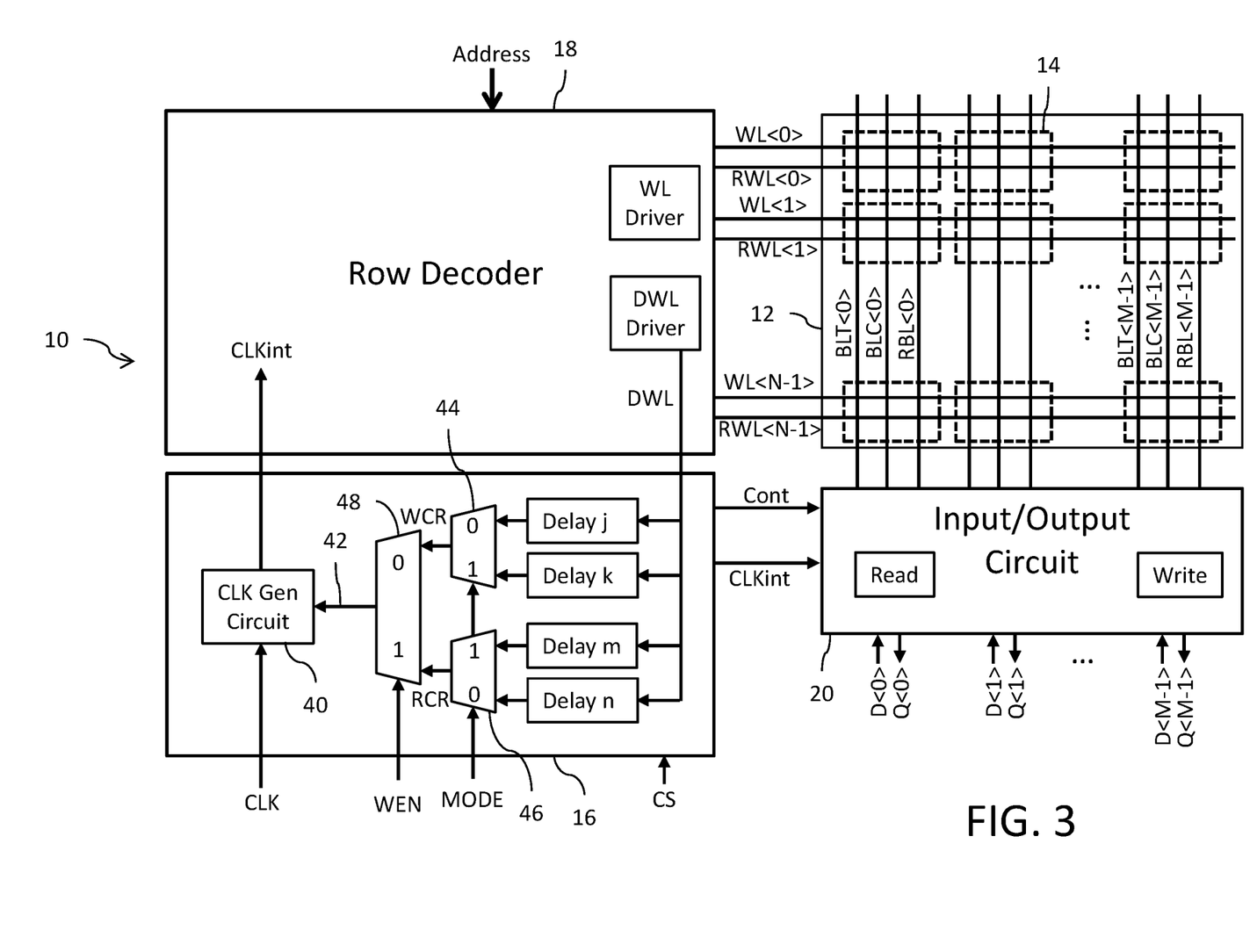
FIG. 3 is a block diagram of a memory circuit.
Figure 4:
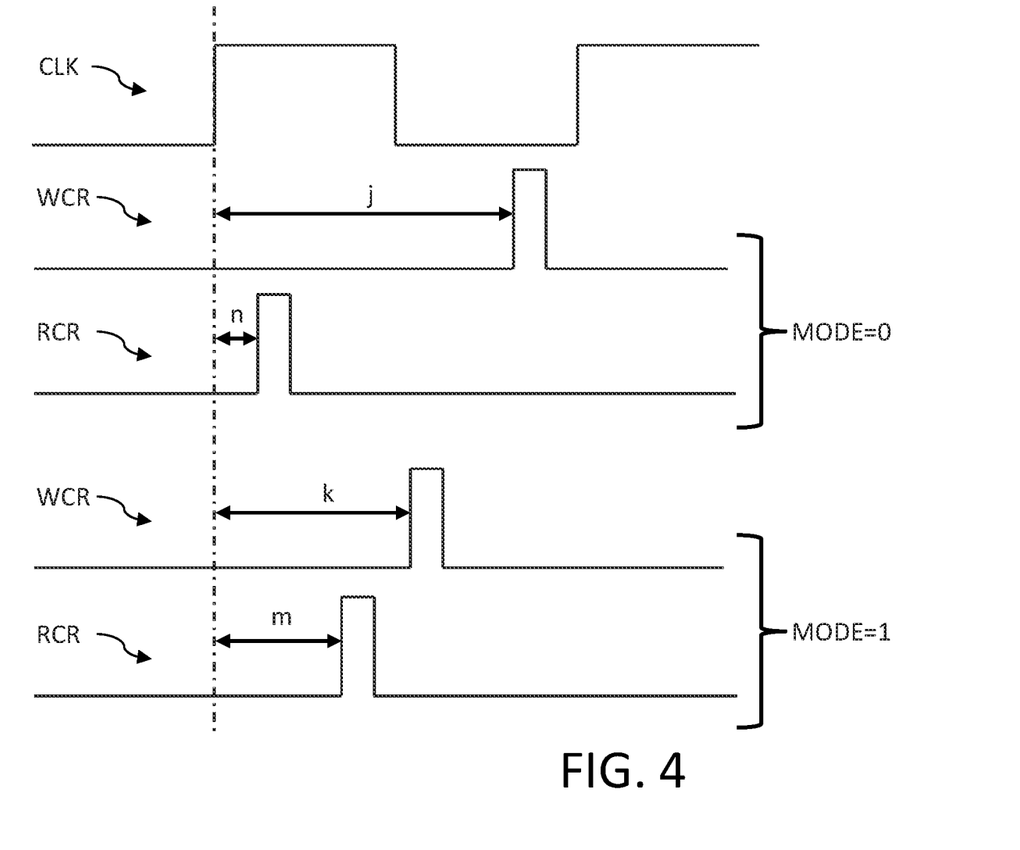
FIG. 4 is timing diagram illustrating delayed generation of a clock reset signal.

Reference is now made to FIG. 3 which shows a block diagram of a memory circuit 10. The circuit 10 includes a memory core 12, a control circuit 16, a row decoder circuit 18 and an input/output circuit 20.

The core 12 is formed by an array of memory cells 14 arranged in a matrix format having N rows and M columns. In an embodiment, each memory cell is a 6 T SRAM cell like that shown in FIG. 1A and includes a word line WL and a pair of complementary bit lines BLT and BLC. In another embodiment, each memory cell is an 8 T SRAM cell like that shown in FIG. 1B and includes a word line WL, a pair of complementary bit lines BLT and BLC, a read word line RWL and a read bit line RBL. The cells 14 in a common row of the matrix are connected to each other through a common word line WL in both the 6 T and 8 T SRAM cell embodiments (and further connected to each other through a common read word line RWL in the 8 T SRAM cell embodiment). The cells 14 in a common column of the matrix are connected to each other through a common pair of complementary bit lines BLT and BLC in both the 6 T and 8 T SRAM cell embodiments (and further connected to each other through a common read bit line RBL in the 8 T SRAM cell embodiment).

The row decoder circuit 18 includes word line driver circuitry for selectively driving each of the word lines WL, RWL. The row decoder circuit 18 further includes dummy word line (DWL) driver circuitry for selectively driving one or more dummy word lines DWL. The word line driver and dummy word line driver circuitry may, for example, be implemented as a CMOS driver circuit (for example, a series connected p-channel and n-channel MOSFET transistor pair forming a logic inverter circuit) coupled to each word line WL, RWL and dummy word line DWL. The word line signal applied to a word line WL, RWL, and driven by its associated word line driver circuitry, is generated by the row decoder circuit 18 in response to the decoding of a received address (Address) and the assertion of an internal clock signal CLKint generated by the control circuit 16. The dummy word line signal applied to the dummy word line DWL, and driven by its associated dummy word line driver circuitry, is generated by the row decoder circuit 18 in response to the assertion of the internal clock signal CLKint generated by the control circuit 16.

The control circuit 16 receives an external clock signal CLK, a chip select signal CS, a write enable signal WEN and a mode control signal MODE. An internal clock generator circuit of the control circuit 16 generates one or more internal clock signals CLKint in response to the external clock signal CLK. One of the generated internal clock signals CLKint is supplied to the row decoder 18 for use in controlling timing of the generation of the word line signals and the dummy word line signal. Another of the generated internal clock signals CLKint may be supplied to the input/output circuit 20 for use in controlling timing of operation of the read circuitry (Read) and write circuitry (Write). The leading edge of the internal clock signal CLKint supplied to the row decoder 18 is triggered by the leading edge of the external clock signal CLK, and the trailing edge of the internal clock signal CLKint supplied to the row decoder 18 is triggered by a reset signal 42. In other words, the pulse width of the internal clock signal CLKint supplied to the row decoder 18 is dependent on the leading edge of the external clock signal CLK and the assertion of the reset signal 42.

The chip select signal CS is asserted when the memory circuit 10 is selected for performing a read operation or write operation. The logic state of the write enable signal WEN controls whether the selected memory circuit 10 is performing a read operation or write operation.

The logic state of the mode control signal MODE controls the selection of a balance between read frequency and write frequency. This will be described in more detail below.

The control circuit 16 may further generate control signaling (Cont) using to control input/output circuit 20 operations (such as, for example, enable signals for enabling sensing by the read circuitry Read or selection circuitry for selectively connecting bit lines, BLT, BLC, RBL to the data input port (D<0>, . . . , D<M−1>) and data output port (Q<0>, . . . , Q<M−1>) for performing column multiplexing operations.

The dummy word line DWL is coupled to the inputs of a plurality of logic delay circuits. The dummy word line signal is received by each logic delay circuit and output after a specified delay time. A first logic delay circuit (Delay j) applies a delay time Tj, a second logic delay circuit (Delay k) applies a delay time Tk, a third logic delay circuit (Delay m) applies a delay time Tm, and a fourth logic delay circuit (Delay n) applies a delay time Tn. The delay time Tj is longer than the delay time Tk. The delay time Tm is longer that the delay time Tn. The dummy word line signal delayed by the first logic delay circuit Delay j and second logic delay circuit Delay k for delay times Tj and Tk, respectively, is applied to the inputs of a multiplexer circuit 44. The dummy word line signal delayed by the third logic delay circuit Delay m and fourth logic delay circuit Delay n for delay times Tm and Tn, respectively, is applied to the inputs of a multiplexer circuit 46.

The selection inputs of the multiplexer circuits 44, 46 receive the mode control signal MODE. In response to a first logic state of the mode control signal MODE, the multiplexer circuit 44 selects the dummy word line signal delayed by the first logic delay circuit Delay j for output, and in response to a second logic state of the mode control signal MODE, the multiplexer circuit 44 selects the dummy word line signal delayed by the second logic delay circuit Delay k for output. The delayed dummy word line signal selected for output from the multiplexer circuit 44 is a write clock reset signal (WCR). In response to the first logic state of the mode control signal MODE, the multiplexer circuit 46 selects the dummy word line signal delayed by the fourth logic delay circuit Delay n for output, and in response to the second logic state of the mode control signal MODE, the multiplexer circuit 46 selects the dummy word line signal delayed by the third logic delay circuit Delay m for output. The delayed dummy word line signal selected for output from the multiplexer circuit 46 is a read clock reset signal (RCR).

The write clock reset signal WCR and read clock reset signal RCR are applied to the inputs of a multiplexer circuit 48. The selection input of the multiplexer circuit 48 receives the write enable signal WEN. In response to a first logic state of the write enable signal WEN (indicative of the memory circuit 10 being controlled to operate in write mode), the multiplexer circuit 48 selects the write clock reset signal WCR for output as the internal clock reset signal 42, and in response to a second logic state of the write enable signal WEN (indicative of the memory circuit 10 being controlled to operate in read mode), the multiplexer circuit 48 selects the read clock reset signal RCR for output as the internal clock reset signal 42.

When the mode control signal MODE is in the first logic state (i.e., logic 0), the memory circuit 10 is said to be operating in a standard speed mode wherein the read frequency is significantly higher than the write frequency. This standard speed mode emphasizes giving the write operation a sufficient amount of time to permit the transistors 22, 24 (see, FIGS. 1A, 1B) of the worst or weakest memory cell a chance to pull up the voltage on the nodes QT, QC to the 90% of Vdd level before a next read or write operation is performed. With the mode control signal MODE in the first logic state, the write cycle time Tcycle_write=Tj+Tx, where Tj is the time delay for Delay j and Tx is the time delay needed by the clock generator circuit to reset the internal clock signal CLKink following assertion of the reset signal 42 (i.e., from signal WCR). Additionally, the read write cycle time Tcycle_read=Tn+Tx, where Tn is the time delay for Delay n and Tx is the time delay needed by the clock generator circuit 40 to reset the internal clock signal CLKink following assertion of the reset signal 42 (i.e., from signal RCR).

When the mode control signal MODE is in the second logic state (i.e., logic 1), the memory circuit 10 is said to be operating in a balanced speed mode wherein the read frequency is compromised to gain write frequency (in other words, where the read and write frequencies are more balanced with (similar to) each other). For this balanced speed mode, write frequency is increased even though the transistors 22, 24 (see, FIGS. 1A, 1B) of the worst or weakest memory cell may not have sufficient time to pull up the voltage on the nodes QT, QC to the 90% of Vdd level. Here, for example, sufficient time to reach 80% of Vdd is acceptable before the next operation begins. Since the node QT or QC is not reaching the sufficient Vdd level, hence it can slow down the next read operation. With the mode control signal MODE in the second logic state, the write cycle time Tcycle_write=Tk+Tx, where Tk is the time delay for Delay k and Tx is the time delay needed by the clock generator circuit 40 to reset the internal clock signal CLKink following assertion of the reset signal 42 (i.e., from signal WCR). Additionally, the read write cycle time Tcycle_read=Tm+Tx, where Tm is the time delay for Delay m and Tx is the time delay needed by the clock generator circuit 40 to reset the internal clock signal CLKink following assertion of the reset signal 42 (i.e., from signal RCR).

In effect, the operation in the balanced speed mode optimizes memory write performance by sacrificing read performance. During the write operation, for the worst (weakest) memory cell, the full swing of the internal latch nodes QT, QC is not ensured before the next read operation. This leads to a performance loss in the read operation, but there is substantial performance improvement for the write operation.

Those skilled in the art will note that since the swing of the internal latch nodes QT, QC to at least 90% of Vdd is not assured for the worst (weakest) memory cell in this balanced speed mode, it may be necessary for some extra verification to be performed in order to address issues with read stability. For example, an identification of the worst bit cell vector for bit cell stability (Read Noise Margin) can be made for an operation followed by a write in the same location, followed by verification of bit cell stability. This is important to ensure bitcell stability in the worst case scenario for the weakest cell, when the internal node has not reached above 90% of Vdd level, and the next read operation begins.

Figure 5A:
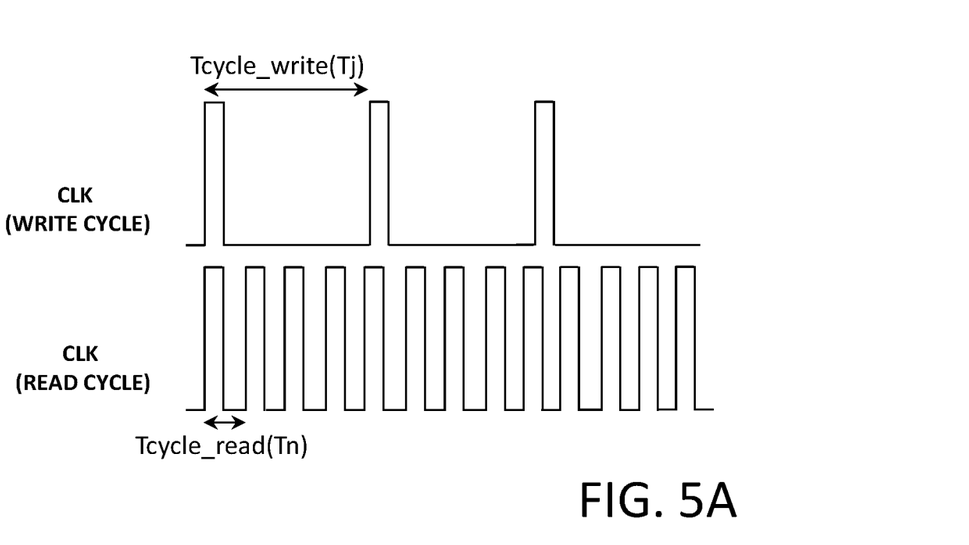
FIGS. 5A and 5B are timing diagrams illustrating difference is write cycle time and read cycle time for different modes of operation of the memory circuit of FIG. 3.
Figure 5B:
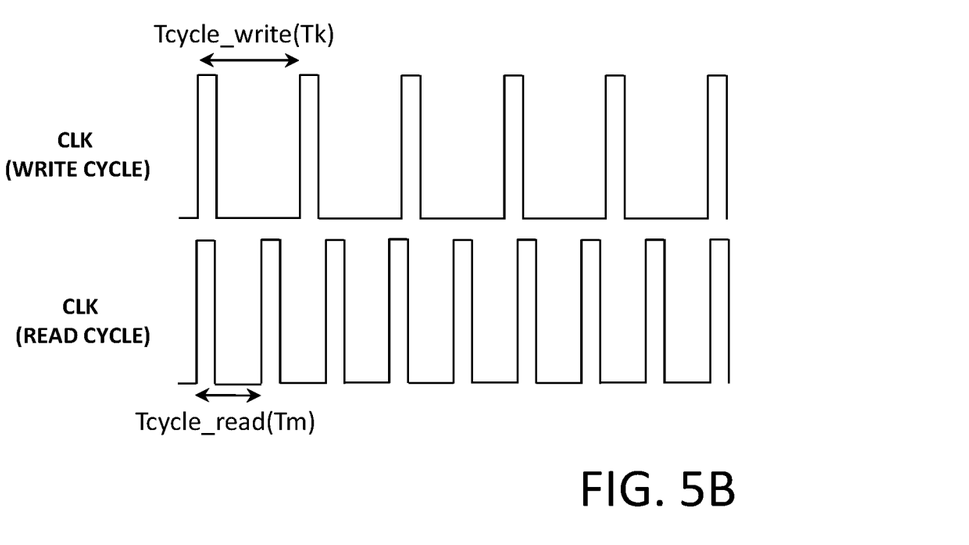

Reference is now made to FIG. 5A which shows a timing diagram for the write clock cycle and read clock cycle when the mode control signal MODE has the first logic state. Here, it will be noted that the write cycle time Tcycle_write is substantially longer than the read write cycle time Tcycle_read. FIG. 5B shows a timing diagram for the write clock cycle and read clock cycle when the mode control signal MODE has the second logic state. Here, it will be noted that there is more of a balance between (similarity of) the write cycle time Tcycle_write and the read write cycle time Tcycle_read.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A memory circuit, comprising:
a memory array including memory cells arranged in a matrix with plural rows and plural columns, each row including a word line connected to the memory cells of the row, and each column including a bit line connected to memory cells of the column;
a row decoder circuit operating in response to an internal clock and a received address to selectively actuate one of the word lines with a word line signal through a word line driver and further actuate a dummy word line with a dummy word line signal through a dummy word line driver; and
a control circuit comprising:
a clock generator configured to generate said internal clock, wherein said internal clock is reset in response to a reset signal;
a first delay circuit receiving the dummy word line signal from the dummy word line and outputting a first delayed dummy word line signal;
a second delay circuit receiving the dummy word line signal from the dummy word line and outputting a second delayed dummy word line signal; and
a first multiplexer circuit configured to receive the first and second delayed dummy word line signals and select said first delayed dummy word line signal for output as said reset signal in response to a first logic state of a mode control signal and select said second delayed dummy word line signal for output as said reset signal in response to a second logic state of the mode control signal.

2. The memory circuit of claim 1, wherein said first and second delay circuits set delays for a memory write cycle time, wherein a first delay time provided by the first delay circuit is longer than a second delay time provided by the second delay circuit.

3. The memory circuit of claim 2, wherein said control circuit further comprises a second multiplexer circuit configured to selectively pass the selected one of the first and second delayed dummy word line signals as the reset signal when said memory circuit is configured for operation in write mode.

4. The memory circuit of claim 1, wherein said first and second delay circuits set delays for a memory read cycle time, wherein a first delay time provided by the first delay circuit is shorter than a second delay time provided by the second delay circuit.

5. The memory circuit of claim 4, wherein said control circuit further comprises a second multiplexer circuit configured to selectively pass the selected one of the first and second delayed dummy word line signals as the reset signal when said memory circuit is configured for operation in read mode.

6. The memory circuit of claim 1, wherein the memory cells are 6T static random access memory cells.

7. The memory circuit of claim 1, wherein the memory cells are 8T static random access memory cells.

8. A memory circuit, comprising:
a memory array including memory cells arranged in a matrix with plural rows and plural columns, each row including a word line connected to the memory cells of the row, and each column including a bit line connected to memory cells of the column;
a row decoder circuit operating in response to an internal clock and a received address to selectively actuate one of the word lines with a word line signal through a word line driver and further actuate a dummy word line with a dummy word line signal through a dummy word line driver; and a control circuit comprising:
- a clock generator configured to generate said internal clock, wherein said internal clock is reset in response to a reset signal;
- a first delay circuit receiving the dummy word line signal from the dummy word line and outputting a first delayed dummy word line signal;
- a second delay circuit receiving the dummy word line signal from the dummy word line and outputting a second delayed dummy word line signal;
- a first multiplexer circuit configured to receive the first and second delayed dummy word line signals and select said first delayed dummy word line signal for output as a write reset signal in response to a first logic state of a mode control signal and select said second delayed dummy word line signal for output as said write reset signal in response to a second logic state of the mode control signal;
- a third delay circuit receiving the dummy word line signal from the dummy word line and outputting a third delayed dummy word line signal;
- a fourth delay circuit receiving the dummy word line signal from the dummy word line and outputting a fourth delayed dummy word line signal;
- a second multiplexer circuit configured to receive the third and fourth delayed dummy word line signals and select said third delayed dummy word line signal for output as a read reset signal in response to the first logic state of the mode control signal and select said fourth delayed dummy word line signal for output as said read reset signal in response to the second logic state of the mode control signal.

9. The memory circuit of claim 8, wherein a first delay time provided by the first delay circuit is longer than a second delay time provided by the second delay circuit.

10. The memory circuit of claim 8, wherein a third delay time provided by the third delay circuit is shorter than a fourth delay time provided by the fourth delay circuit.

11. The memory circuit of claim 8, wherein a first delay time provided by the first delay circuit is longer than a second delay time provided by the second delay circuit, and wherein a third delay time provided by the third delay circuit is shorter than a fourth delay time provided by the fourth delay circuit.

12. The memory circuit of claim 8, wherein said control circuit further comprises a third multiplexer circuit configured to selectively pass the selected one of the first and second delayed dummy word line signals as the reset signal when said memory circuit is configured for operation in write mode and to selectively pass the selected one of the third and fourth delayed dummy word line signals as the reset signal when said memory circuit is configured for operation in read mode.

13. The memory circuit of claim 8, wherein the memory cells are 6T static random access memory cells.

14. The memory circuit of claim 8, wherein the memory cells are 8T static random access memory cells.

15. A method, comprising:
- generating an internal clock signal having a leading edge controlled by an edge of an external clock and a trailing edge controlled by a reset signal;
- asserting a dummy word line signal for application to a memory circuit in response to the internal clock signal;
- applying a first delay time to the dummy word line signal to generate a first delayed dummy word line signal;
- applying a second delay time to the dummy word line signal to generate a second delayed dummy word line signal;
- selecting the first delayed dummy word line signal for output as said reset signal in response to a first logic state of a mode control signal; and
- selecting the second delayed dummy word line signal for output as said reset signal in response to a second logic state of the mode control signal.

16. The method of claim 15, wherein said first and second delay times set delays for a memory write cycle time, wherein the first delay time is longer than the second delay time.

17. The method of claim 16, further comprising selectively passing the selected one of the first and second delayed dummy word line signals as the reset signal when said memory circuit is configured for operation in write mode.

18. The method of claim 15, wherein said first and second delay times set delays for a memory read cycle time, wherein the first delay time is shorter than the second delay time.

19. The method of claim 18, further comprising selectively passing the selected one of the first and second delayed dummy word line signals as the reset signal when said memory circuit is configured for operation in read mode.

* * * * *